(12) United States Patent
Ferrari et al.

(10) Patent No.: US 11,871,668 B2
(45) Date of Patent: Jan. 9, 2024

(54) THERMOELECTRIC GENERATOR

(71) Applicant: STMICROELECTRONICS S.R.L., Agrate Brianza (IT)

(72) Inventors: Paolo Ferrari, Gallarate (IT); Flavio Francesco Villa, Milan (IT); Luca Zanotti, Agrate Brianza (IT); Andrea Nomellini, Milan (IT); Luca Seghizzi, Milan (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 0 days.

(21) Appl. No.: 17/158,904

(22) Filed: Jan. 26, 2021

(65) Prior Publication Data
US 2021/0242387 A1 Aug. 5, 2021

(30) Foreign Application Priority Data
Jan. 31, 2020 (IT) .................. 102020000001879

(51) Int. Cl.
*H10N 10/17* (2023.01)
*H10N 10/01* (2023.01)

(52) U.S. Cl.
CPC ............. *H10N 10/17* (2023.02); *H10N 10/01* (2023.02)

(58) Field of Classification Search
CPC ......... H01L 35/08; H01L 35/30; H01L 35/32; H01L 35/34; H10N 10/17; H10N 10/01
USPC .................................................. 136/200–242
See application file for complete search history.

(56) References Cited

U.S. PATENT DOCUMENTS

| 2,990,439 | A | 6/1961 | Goldsmid et al. |
| 5,689,087 | A * | 11/1997 | Jack .......................... G01J 5/12 136/213 |
| 7,485,345 | B2 | 2/2009 | Renn et al. |
| 2002/0139171 | A1* | 10/2002 | Benzel .................. G01N 25/68 73/29.01 |
| 2008/0044939 | A1* | 2/2008 | Nassiopoulou ........ G01K 7/028 438/54 |
| 2008/0271772 | A1* | 11/2008 | Leonov ................... H01L 35/34 136/205 |

(Continued)

FOREIGN PATENT DOCUMENTS

| EP | 1 976 034 A2 | 10/2008 |
| WO | 2013/089824 A1 | 6/2013 |
| WO | WO-2018218127 A1 * | 11/2018 ............. H01L 35/32 |

OTHER PUBLICATIONS

Material Property Database: Polyimide, <http://web.mit.edu/6.777/www/matprops/polyimide.htm > (Year: 2004).*

(Continued)

*Primary Examiner* — Andrew J Golden
(74) *Attorney, Agent, or Firm* — Seed IP Law Group LLP

(57) ABSTRACT

A thermoelectric generator includes a substrate and one or more thermoelectric elements on the substrate and each configured to convert a thermal drop across the thermoelectric elements into an electric potential by Seebeck effect. The thermoelectric generator includes a cavity between the substrate and the thermoelectric elements. The thermoelectric generator includes, within the cavity, a support structure for supporting the thermoelectric elements. The support structure has a thermal conductivity lower than a thermal conductivity of the substrate.

17 Claims, 3 Drawing Sheets

(56) References Cited

U.S. PATENT DOCUMENTS

| | | | | |
|---|---|---|---|---|
| 2011/0083713 | A1* | 4/2011 | Narducci | H01L 35/32 136/230 |
| 2011/0114146 | A1* | 5/2011 | Scullin | H01L 35/34 438/54 |
| 2011/0277801 | A1* | 11/2011 | Fuchs | H01L 35/08 136/201 |
| 2014/0069185 | A1* | 3/2014 | Tu | H01L 35/34 73/204.26 |
| 2014/0246066 | A1 | 9/2014 | Chen et al. | |
| 2017/0200880 | A1* | 7/2017 | Nastasi | H01L 35/325 |
| 2018/0342661 | A1* | 11/2018 | Steinmann | H01L 35/34 |

OTHER PUBLICATIONS

Virginia Semiconductor, Basic Mechanical and Thermal Properties of Silicon, pp. 1-5 (Year: 2003).*

Material Property Database: Thermal silicon oxide, < http://web.mit.edu/~6.777/www/matprops/sio2.htm > (Year: 2004).*

Pennelli et al., "Fabrication Techniques for Thermoelectric Devices Based on Nanostructured Silicon", *Journal of Nanoscience and Nanotechnology*, vol. 17, No. 3, 2017, pp. 1627-1633.

Pennelli et al., "High-power thermoelectric generators based on nanostructured silicon", *Semiconductor Science and Technology*, vol. 31, 2016, 7 pages.

Perez-Marín et al., "Micropower thermoelectric generator from thin Si membranes", Nano Energy, vol. 4, Mar. 2014, pp. 73-80.

Tomita et al., "10μW/cm2-Class High Power Density Planar Si-Nanowire Thermoelectric Energy Harvester Compatible with CMOS-VLSI Technology", IEEE Symposium on VLSI Technology, Honolulu, HI, 2018, pp. 93-94.

Waseda University, "High-power thermoelectric generator utilizes thermal difference of only 5° C.", *Eurekalert*, Jul. 6, 2018, 3 pages, <https://www.eurekalert.org/pub_releases/2018-07/wu-htg070618.php>.

* cited by examiner

THERMOELECTRIC GENERATOR

BACKGROUND

Technical Field

The present disclosure generally relates to the field of MEMS (Micro Electro-Mechanical Systems) devices. Particularly, the present disclosure generally relates to the field of thermoelectric generators, i.e., devices configured to directly convert a thermal energy (particularly, a temperature gradient or thermal drop) into electric energy (particularly, an electric potential) by Seebeck effect.

Description of the Related Art

Direct conversion of thermal energy into electric energy by Seebeck effect is a promising approach for harvesting energy from heat sources, particularly from heat sources that otherwise would not be exploited (such as waste heat of industrial plants, residual heat of car engines, low temperature thermal sources), e.g., due to the reduced temperature gradients that would be attained.

Tellurium-based thermoelectric generators are known.

Tellurium compounds, such as bismuth telluride ($Bi_2Te_3$), exhibit good Seebeck coefficient, high electrical conductivity and low thermal conductivity. As one example, the thermal conductivity of bismuth telluride is 2 W/mK.

A conventional tellurium-based thermoelectric generator includes a plurality of interconnected n-doped bismuth telluride elements and p-doped bismuth telluride elements between a pair of opposite silicon substrates, the plurality of interconnected n-doped and p-doped bismuth telluride elements acting as thermoelectric elements capable of converting a thermal drop across them into an electric potential by Seebeck effect.

However, tellurium-based thermoelectric generators typically exhibit a relatively good efficiency only in a limited temperature range (usually, of the order of 100 K around room temperature) and thermoelectric properties that rapidly degrade as temperature increases. This reduces the fields of application of the tellurium-based thermoelectric generators.

Moreover, tellurium is a relatively rare element, which inherently limits a widespread use thereof.

Furthermore, an extensive use of tellurium compounds, such as bismuth telluride $Be_2Te_3$, could generate environmental problems, in particular in term of end-of-life disposal.

Silicon-based thermoelectric generators are also known.

A conventional silicon-based thermoelectric generator includes a silicon substrate and, suspended on the substrate, a plurality of interconnected silicon elements acting as thermoelectric elements capable of converting a thermal drop across them into an electric potential by Seebeck effect. A cavity is provided between the substrate and the silicon elements that avoids the bypass of the heat current and secures the temperature gradient across the thermoelectric elements.

BRIEF SUMMARY

Known silicon-based thermoelectric generators are not satisfactory for some modern technological specifications.

In fact, the presence of a cavity reduces the mechanical stability of the conventional silicon-based thermoelectric generators.

The present disclosure provides a thermoelectric generator capable of overcoming drawbacks of known silicon-based thermoelectric generators.

The thermoelectric generator includes a substrate. The thermoelectric generator includes, on the substrate, one or more thermoelectric elements each configured to convert a thermal drop across the thermoelectric elements into an electric potential by Seebeck effect. The thermoelectric generator includes a cavity between the substrate and the thermoelectric elements. The thermoelectric generator includes, within the cavity, a support structure for supporting the thermoelectric elements. The support structure has a thermal conductivity lower than the thermal conductivity of the substrate.

According to an embodiment, additional or alternative to any of the preceding embodiments, a ratio between the thermal conductivity of the support structure and the thermal conductivity of the substrate is lower than 0.02.

According to an embodiment, additional or alternative to any of the preceding embodiments, the support structure includes at least one material having a thermal conductivity below 2 W/mK.

According to an embodiment, additional or alternative to any of the preceding embodiments, the at least one material includes at least one among porous silicon, hydrogen silsesquioxane and high density plasma oxide.

According to an embodiment, additional or alternative to any of the preceding embodiments, said cavity is filled with said at least one material.

According to an embodiment, additional or alternative to any of the preceding embodiments, the at least one thermoelectric element includes a plurality of interconnected thermoelectric nanostructures.

According to an embodiment, additional or alternative to any of the preceding embodiments, said plurality of interconnected thermoelectric nanostructures include a plurality of thermoelectric nanostructures having a first type of conductivity and a plurality of thermoelectric nanostructures having a second type of conductivity opposite the first type.

According to an embodiment, additional or alternative to any of the preceding embodiments, said thermoelectric nanostructures are made of silicon.

According to an embodiment, additional or alternative to any of the preceding embodiments, said thermoelectric nanostructures are made of polysilicon.

Another aspect of the present disclosure relates to a method for manufacturing a thermoelectric generator. The method includes providing a substrate and providing, on the substrate, one or more thermoelectric elements each configured to convert a thermal drop across the thermoelectric element into an electric potential by Seebeck effect. The method includes forming a cavity between the substrate and the thermoelectric elements and providing, within the cavity, a support structure for supporting the thermoelectric elements, the support structure having a thermal conductivity lower than the thermal conductivity of the substrate.

BRIEF DESCRIPTION OF THE SEVERAL VIEWS OF THE DRAWINGS

These and other features and advantages of the present disclosure will be made apparent by the following description of some exemplary and non-limitative embodiments thereof; the following description should be read making reference to the attached drawings, wherein.

DETAILED DESCRIPTION

With reference to the drawings, they show simplified representations of thermoelectric generators according to embodiments of the present disclosure.

In the following, when one or more features are introduced by the wording "according to an embodiment", they are to be construed as features additional or alternative to any feature(s) previously introduced, unless otherwise indicated and/or unless an incompatibility between combinations of features that would be immediately apparent to the person skilled in the art.

In the following, directional terminology (for example, upper, lower, lateral, central, longitudinal, transverse and vertical) associated with the thermoelectric generators and components thereof will be used only in connection with their orientation in the figures, and is not indicative of any specific orientation of use thereof. In this respect, a reference system is illustrated in the figures, the reference system being identified by three orthogonal directions X, Y, and Z referred to as longitudinal direction X, transverse direction Y and vertical direction Z.

For the sake of conciseness, only components of the thermoelectric generators deemed relevant to the understanding of the present disclosure are shown in the figures and will be discussed here below, with other well-known components of the user thermoelectric generators that have been intentionally omitted.

Figure 1A:
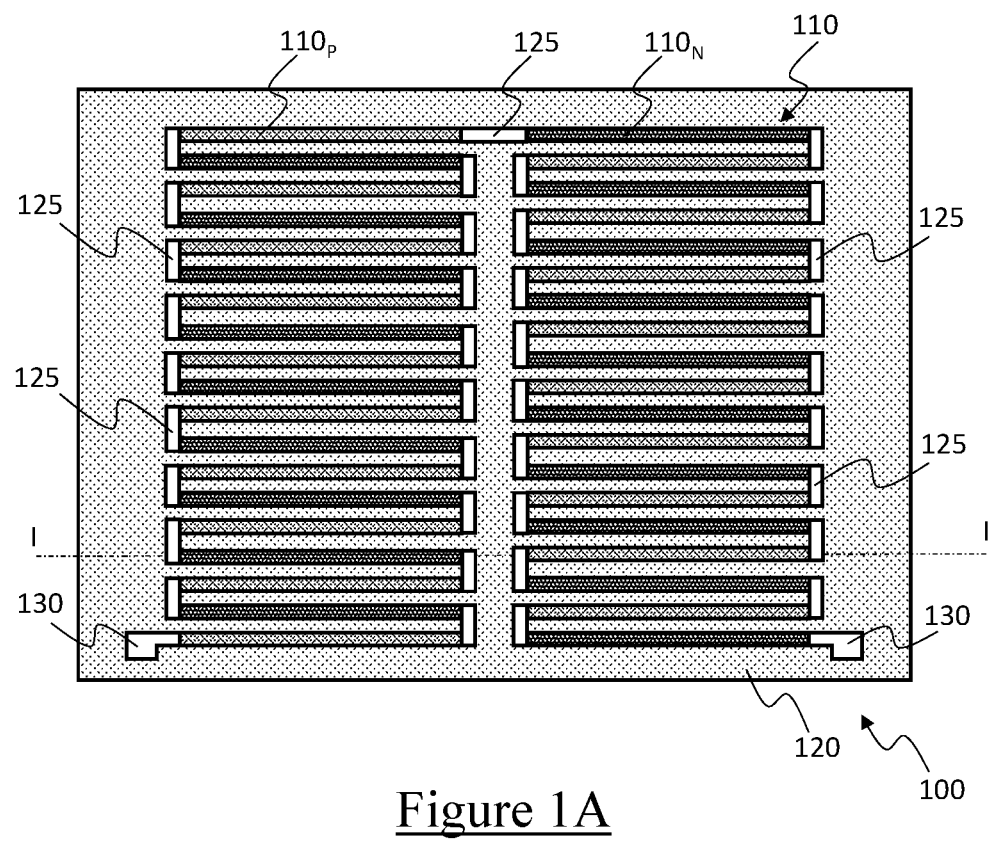
FIGS. 1A and 1B show a top view and a sectional view, respectively, of a thermoelectric generator according to an embodiment.
Figure 1B:
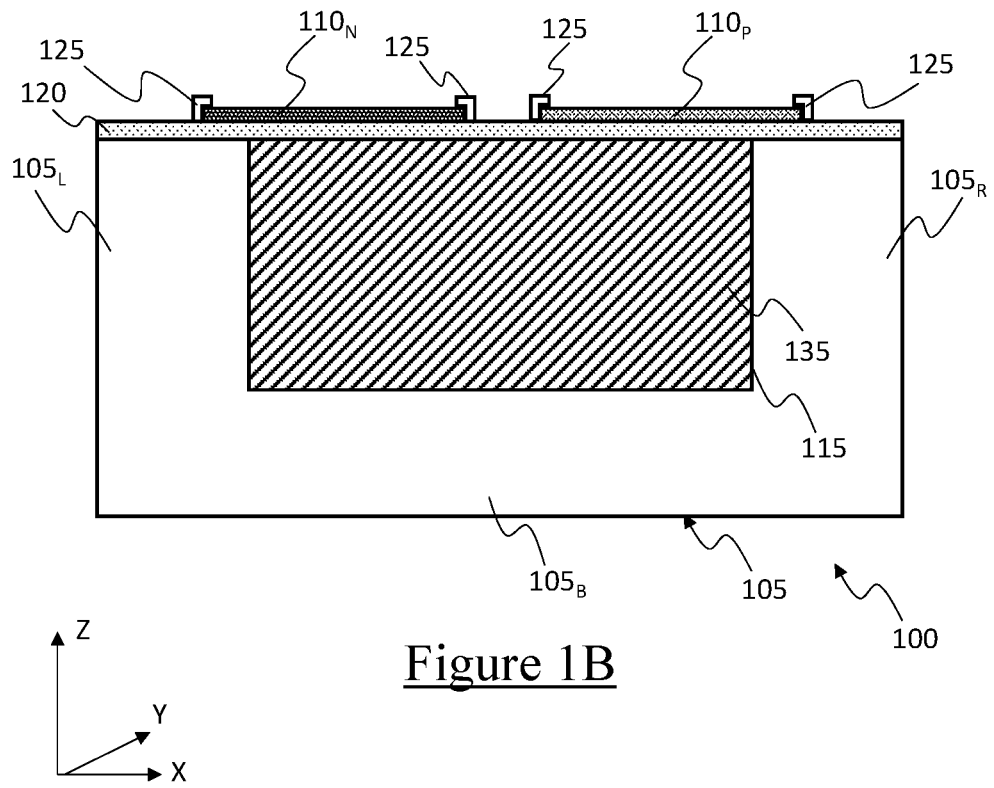

With particular reference to FIGS. 1A and 1B, they show a top view and a sectional view, respectively, of a thermoelectric generator 100 according to an embodiment of the present disclosure. Particularly, FIG. 1B show the thermoelectric generator 100 along the sectional axis I-I illustrated in FIG. 1A.

According to an embodiment, the thermoelectric generator 100 includes a substrate 105. According to an embodiment, the substrate 105 includes a semiconductor material. According to an embodiment, the semiconductor material includes silicon.

According to an embodiment, the thermoelectric generator 100 includes one or more elements (referred to as thermoelectric elements), globally denoted by the number reference 110, configured to convert a thermal drop across them into an electric potential by Seebeck effect.

According to an embodiment, the thermoelectric elements 110 are on or above the substrate 105.

According to an embodiment, the thermoelectric generator 100 includes a cavity 115 between the substrate 105 and the thermoelectric elements 110.

According to an embodiment, the cavity 115 is defined by a gap, along the vertical direction Z, between the substrate 105 and the thermoelectric elements 110.

The gap between the substrate 105 and the thermoelectric elements 110 may be achieved through any structural expedient.

According to an embodiment, the substrate 105 has an internally hollow structure. According to an embodiment, the substrate 105 includes a bottom portion $105_B$, and a first (left, taking the orientation in the figures as a reference) side portion $105_L$ and a second (right, taking the orientation in the figures as a reference) side portion $105_R$ provided at opposite side ends of the bottom portion $105_B$ of the substrate 105 extending in height along the vertical direction Z beyond the bottom portion $105_B$ of the substrate 105. In this embodiment, the side $105_L$, $105_R$ and bottom $105_B$ portions of the substrate 105 delimit the cavity 115, and the extension in height of the side portions $105_L$, $105_R$ determines the gap between the substrate 105 (particularly, the bottom portion $105_B$ thereof) and the thermoelectric elements 110.

According to an embodiment, the thermoelectric generator 100 includes, on the substrate 105, an electrically insulating layer 120.

According to an embodiment, the thermoelectric elements 110 are formed on the electrically insulating layer 120.

According to an embodiment, the electrically insulating layer 120 includes silicon dioxide.

According to an embodiment, the electrically insulating layer 120 extends in length along the longitudinal direction X up to the side portions $105_L$, $105_R$ of the substrate 105. The electrically insulating layer 120 rests at least partially (completely, in the illustrated example) on the side portions $105_L$, $105_R$ of the substrate 105.

According to an embodiment, the thermoelectric elements 110 include a plurality of interconnected thermoelectric nanostructures. The thermoelectric nanostructure are, for example, thermoelectric nanowires.

According to an embodiment, the plurality of interconnected thermoelectric nanowires include a plurality of thermoelectric nanowires having a N-type conductivity, hereinafter referred to as N-type thermoelectric nanowires $110_N$, and a plurality of thermoelectric nanowires having a P-type conductivity, hereinafter referred to as P-type thermoelectric nanowires $110_P$.

According to an embodiment, the thermoelectric nanowires are made of silicon (the N-type thermoelectric nanowires $110_N$ being thus N-doped silicon thermoelectric nanowires, and the P-type thermoelectric nanowires $110_P$ being thus P-doped silicon thermoelectric nanowires). According to an embodiment, the N-type thermoelectric nanowires $110_N$ include phosphorus-doped silicon, and the P-type thermoelectric nanowires $110_P$ comprise boron-doped silicon.

According to an embodiment, the thermoelectric nanowires are made of polysilicon (the N-type thermoelectric nanowires $110_N$ being thus N-doped polysilicon thermoelectric nanowires, and the P-type thermoelectric nanowires $110_P$ being thus P-doped polysilicon thermoelectric nanowires). According to an embodiment, the N-type thermoelectric nanowires $110_N$ include phosphorus-doped polysilicon, and the P-type thermoelectric nanowires $110_P$ include boron-doped polysilicon.

In the following, the N-type thermoelectric nanowires $110_N$ and the P-type thermoelectric nanowires $110_P$ will be also referred to as thermoelectric nanowires $110_N$,$110_P$, when distinguishing between them is not relevant for the purposes of the present disclosure.

According to an embodiment, the thermoelectric nanowires $110_N$, $110_P$ exhibit a thermal conductivity below 10 W/mK.

In FIGS. 1A and 1B, the N-type thermoelectric nanowires $110_N$ and the P-type thermoelectric nanowires $110_P$ are graphically differentiated to each other by means of respective filling effects.

As can be better appreciated in FIG. 1A, according to an embodiment, the N-type thermoelectric nanowires $110_N$ and the P-type thermoelectric nanowires $110_P$ are electrically connected in series to each other in an alternate manner through respective electrically conductive connectors 125, i.e., with each N-type thermoelectric nanowire $110_N$ that is electrically connected in series to a following P-type thermoelectric nanowire $110_P$ through a respective electrically conductive connector 125 and a respective preceding P-type thermoelectric nanowire $110_P$ through a respective electrically conductive connector 125.

According to an embodiment, the N-type thermoelectric nanowires $110_N$ and the P-type thermoelectric nanowires $110_P$ are formed on the electrically insulating layer 120 according to a serpentine planar arrangement. Some aspects of a thermoelectric generator are disclosed in M. Tomita et al., "10 $\mu W/cm2$-Class High Power Density Planar Si-Nanowire Thermoelectric Energy Harvester Compatible with CMOS-VLSI Technology".

Since the N-type thermoelectric nanowires $110_N$ and the P-type thermoelectric nanowires $110_P$ have opposite types of conductivity, they also exhibit opposite Seebeck coefficients: when a heat source (not shown) is placed on the thermoelectric generator 100, a temperature gradient is established across the thermoelectric nanowires $110_N, 110_P$ (indeed, the thermoelectric nanowires $110_N, 110_P$ are between the heat source and the substrate 105, which acts as a cold source or heat sink), and a potential difference is established between electrically conductive pads 130 at the ends of the serpentine arrangement, due to the charge carrier flux (within thermoelectric nanowires $110_N, 110_P$) driven by the temperature gradient.

The thermoelectric generator so far disclosed is known in the art, and belongs to the category of thermoelectric generators in which the thermoelectric elements (the thermoelectric nanowires $110_N, 110_P$ in the example at issue) are suspended on the substrate 115. In this category of thermoelectric generators, if, on the one hand, the presence of the cavity 115 allows the temperature gradient to be maintained or secured across the thermoelectric nanowires $110_N, 110_P$, on the other hand the presence of the cavity 115 reduces the mechanical stability.

In order to increase the mechanical stability, and compensate for the presence of the cavity 115, according to an embodiment the thermoelectric generator 100 includes, within the cavity 115, a support structure 135 for supporting the thermoelectric nanowires $110_N, 110_P$ (particularly, the thermoelectric nanowires $110_N, 110_P$/electrically insulating layer 120 assembly, in the example at issue).

According to an embodiment, the support structure 135 has a thermal conductivity lower than the thermal conductivity of the thermoelectric nanowires $110_N, 110_P$, whereby heat current from the heat source to the cold source is substantially not (thermally) affected by the support structure 135.

According to an embodiment, the support structure 135 has a thermal conductivity much lower, such as from 10 to 1000 (for example, 100) times lower, than the thermal conductivity of the substrate 115.

According to an embodiment, a ratio between the thermal conductivity of the support structure 135 and the thermal conductivity of the substrate 105 is lower than 0.02.

According to an embodiment, the support structure 135 has a thermal conductivity below 2 W/mK, the thermal conductivity of silicon being about 148 W/mK.

According to an embodiment, the support structure 135 includes at least one material among porous silicon, hydrogen silsesquioxane (HSQ) and high density plasma oxide (HDP), or any combination thereof.

The thermal conductivity of porous silicon decreases as porosity increases. Just as an example, the thermal conductivity of porous silicon ranges from 0.15 W/mK to 1.5 W/mK for porosity ranging from 75% to 25%, respectively.

The thermal conductivity of HSQ and HDP are about 0.37 W/mK and 1.2 W/mK.

According to an embodiment, the cavity 115 is (completely, or substantially completely) filled with one or more materials among porous silicon, HSQ and HDP, the material (s) filling the cavity 115 forming the support structure 135.

According to an embodiment, not shown, the cavity 115 is only partially filled with one or more materials among porous silicon, HSQ and HDP, with the material(s) partially filling the cavity 115 that may be in the form of, for example, one or more vertical pillars extending between the bottom portion $105_B$ of the substrate 105 and the thermoelectric nanowires $110_N$, $110_P$ (particularly, the thermoelectric nanowires $110_N$, $110_P$/electrically insulating layer 120 assembly, in the example at issue).

Figure 2:
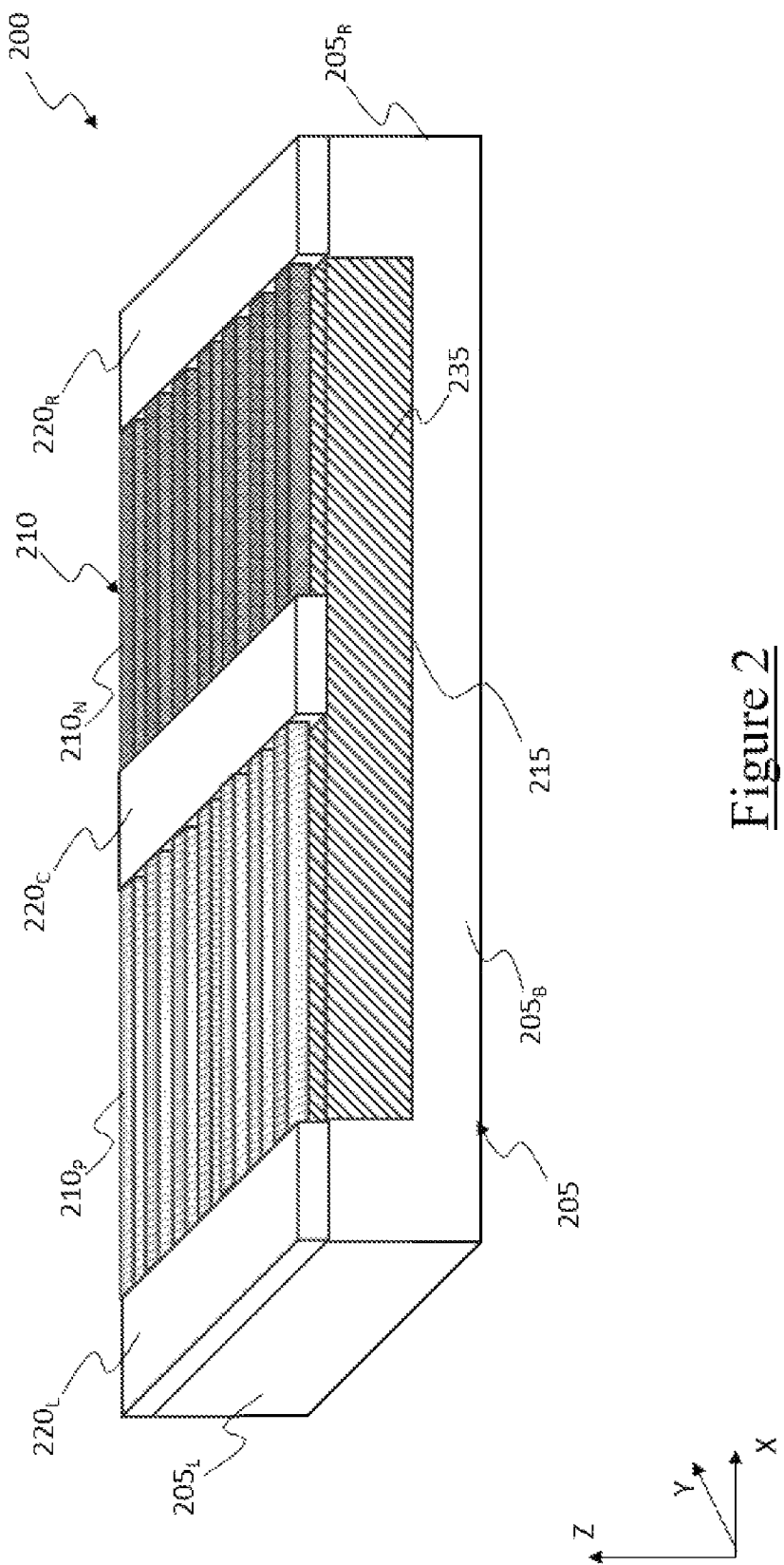
FIG. 2 shows a perspective view of a thermoelectric generator according to another embodiment.

FIG. 2, shows a perspective view of a thermoelectric generator 200 according to another embodiment of the present disclosure.

Similarly to the thermoelectric generator 100, the thermoelectric generator 200 is an improvement of a known thermoelectric generator belonging to the category of thermoelectric generators in which the thermoelectric elements are suspended on a substrate and a cavity is provided that allows the temperature gradient to be maintained or secured across the thermoelectric elements.

The thermoelectric generator 200 is similar in structure to the thermoelectric generator 100, whereby same or similar features will not be deeply discussed for the sake of conciseness.

According to an embodiment, the thermoelectric generator 200 includes a substrate 205. According to an embodiment, the substrate 205 includes a semiconductor material. According to an embodiment, the semiconductor material includes silicon. According to an embodiment, the thermoelectric generator 200 includes one or more thermoelectric elements, globally denoted by the number reference 210, configured to convert a thermal drop across them into an electric potential by Seebeck effect.

According to an embodiment, the thermoelectric generator 200 includes a cavity 215 between the substrate 205 and the thermoelectric elements 210.

According to an embodiment, the cavity 215 is defined by a gap, along the vertical direction Z, between the substrate 205 and the thermoelectric elements 210.

The gap between the substrate 205 and the thermoelectric elements 210 may be achieved through any structural expedient.

According to an embodiment, the substrate 205 has an internally hollow structure. According to an embodiment, the substrate 205 includes a bottom portion $205_B$. The substrate 205 also includes a first (left, taking the orientation in the figures as a reference) side portion $205_L$ and a second (right, taking the orientation in the figures as a reference) side portion $205_B$ extending in height beyond the bottom portion $205_B$ of the substrate 205. In this embodiment, the side $205_L, 205_R$ and bottom $205_B$ portions of the substrate 205 delimit the cavity 215, and the extension in height of the side portion $205_P$ determines the gap between the substrate 205 (particularly, the bottom portion $205_B$ thereof) and the thermoelectric elements 210.

According to an embodiment, not shown, electrically insulating layers are formed on the side portions $205_L$, $205_B$ of the substrate 205, such electrically insulating layers comprising for example silicon dioxide.

According to an embodiment, not shown, the substrate 205 is a solid substrate (i.e., it features no internally hollow structure) and electrically insulating layers are formed at left and right sides thereof: in this embodiment, the electrically insulating layers and the substrate delimit the cavity on which the thermoelectric elements may be suspended.

According to an embodiment, the thermoelectric elements 210 include a plurality of interconnected thermoelectric nanostructures, the thermoelectric nanostructures being for example thermoelectric nanomembranes.

According to an embodiment, the thermoelectric nanomembranes 210 are parallelepiped-shaped thermoelectric nanomembranes arranged with their largest surfaces perpendicular to the substrate 205. According to an embodiment, the thermoelectric generator 200 includes a first side mass $220_L$ and a second side mass $220_R$ side provided on the left $205_L$ and right $205_B$ side portions of the substrate 205, respectively, and a third mass $220_C$ between, or separated from the left $220_L$ and right $220_R$ side masses by the thermoelectric elements 210. According to an embodiment, the mass $220_C$ is centrally located, along the longitudinal direction X, between the left $205_L$ and right $205_B$ side portions of the substrate 205, therefore it will be referred to as central mass $220_C$ in the following.

According to an embodiment, the thermoelectric nanomembranes between (i.e., connected to) the left side mass $220_L$ and the central mass $220_C$ include a plurality of thermoelectric nanomembranes having a P-type conductivity (hereinafter referred to as P-type thermoelectric nanomembranes $210_P$) and the thermoelectric nanomembranes between (i.e., connected to) the right side mass $220_R$ and the central mass $220_C$ include a plurality of thermoelectric nanomembranes having a N-type conductivity (hereinafter referred to as N-type thermoelectric nanomembranes $210_N$).

According to an embodiment, not shown, the N-type thermoelectric nanomembranes $210_N$ are located between the left side mass $220_L$ and the central mass $220_C$, and the P-type thermoelectric nanomembranes $210_P$ are located between the right side mass $220_R$ and the central mass $220_C$.

According to an embodiment, the N-type thermoelectric nanomembranes $210_N$ are parallel to each other, the P-type thermoelectric nanomembranes $210_P$ are parallel to each other, and the parallel-packed N-type thermoelectric nanomembranes $210_N$ are in series with the parallel-packed P-type thermoelectric nanomembranes $210_P$.

Some aspects of a thermoelectric generator disclosed in G. Pennelli and M. Maccucci, "*High-power thermoelectric generators based on nanostructured silicon*".

According to an embodiment, the thermoelectric nanomembranes are made of silicon (the N-type thermoelectric nanomembranes $210_N$ being thus N-doped silicon thermoelectric nanomembranes, and the P-type thermoelectric nanomembranes $210_P$ being thus P-doped silicon thermoelectric nanomembranes). According to an embodiment, the N-type thermoelectric nanomembranes $210_N$ include phosphorus-doped silicon, and the P-type thermoelectric nanomembranes $210_P$ include boron-doped silicon.

According to an embodiment, the thermoelectric nanomembranes are made of polysilicon (the N-type thermoelectric nanowires $210_N$ being thus N-doped polysilicon thermoelectric nanomembranes, and the P-type thermoelectric nanomembranes $210_P$ being thus P-doped polysilicon thermoelectric nanomembranes). According to an embodiment, the N-type thermoelectric nanomembranes $210_N$ include phosphorus-doped polysilicon, and the P-type thermoelectric nanomembranes $210_P$ include boron-doped polysilicon.

According to an embodiment, one or more (preferably all) among the side $220_L$, $220_R$ and central $220_C$ masses are made of silicon.

According to an embodiment, one or more (preferably all) among the side $220_L$, $220_R$ and central $220_C$ masses are made of polysilicon.

According to an embodiment, the thermoelectric nanomembranes $210_N$, $210_P$ exhibit a thermal conductivity below 10 W/mK. By properly sizing, e.g., reducing, nanomembrane thickness, a thermal conductivity lower than that of nanowires can be achieved.

Since the N-type thermoelectric nanomembranes $210_N$ and the P-type thermoelectric nanomembranes $210_P$ have opposite types of conductivity, they also exhibit opposite Seebeck coefficients: when a heat source (not shown) is placed on the thermoelectric generator 200 (e.g., on one or more among the side $220_L$,$220_R$ and central $220_C$ masses), a temperature gradient is established across the thermoelectric nanomembranes $210_N$,$210_P$, and a potential difference is established due to the charge carrier flux driven by the temperature gradient.

The temperature gradient established across the thermoelectric nanomembranes $210_N$, $210_P$ is maintained or secured thanks to the presence of the cavity 215, which on the other hand would reduce the mechanical stability of the thermoelectric generator 200.

In order to increase the mechanical stability of the thermoelectric generator 200, and compensate for the presence of the cavity 215, according to an embodiment the thermoelectric generator 200 includes, within the cavity 215, a support structure 235 for supporting the thermoelectric nanomembranes $210_N$, $210_P$.

According to an embodiment, the support structure 235 has a thermal conductivity lower than the thermal conductivity of the thermoelectric nanomembranes $210_N$,$210_P$, whereby heat current from the heat source to the cold source is substantially not (thermally) affected by the support structure.

According to an embodiment, the support structure 235 has a thermal conductivity much lower, such as from 10 to 1000 (for example, 100) times lower, than the thermal conductivity of the substrate 205.

According to an embodiment, a ratio between the thermal conductivity of the support structure 235 and the thermal conductivity of the substrate 205 is lower than 0.02.

According to an embodiment, the support structure 235 has a thermal conductivity below 2 W/mK.

According to an embodiment, the support structure 235 includes at least one material among porous silicon, hydrogen silsesquioxane (HSQ) and high density plasma oxide (HDP).

According to an embodiment, the cavity 215 is (completely, or substantially completely) filled, with one or more materials among porous silicon, HSQ and HDP, the material(s) filling the cavity 215 forming the support structure 235.

According to an embodiment, not shown, the cavity 215 is only partially filled with one or more materials among porous silicon, HSQ and HDP. According to an embodiment, the material(s) partially filling the cavity 215 are in the form of one or more vertical pillars extending between the bottom portion $205_B$ of the substrate 205 and the thermoelectric nanomembranes $210_N$,$210_P$ (or the side $220_L$,$220_R$ and central $220_C$ masses).

Therefore, as discussed in the foregoing, the embodiment of FIGS. 1A and 1B and the embodiment of FIG. 2 refer both to a category of thermoelectric generator (hereinafter referred to as cavity-based thermoelectric generator) comprising a substrate, thermoelectric elements on or above the substrate, and a cavity between the substrate and the thermoelectric elements; according to the principles of the present disclosure discussed above, any cavity-based thermoelectric generator may be provided, within the cavity, with a support structure for supporting the thermoelectric elements, the support structure having a thermal conductivity lower than the thermal conductivity of the substrate, preferably lower enough that the heat current from the heat source to the cold source is substantially not (thermally) affected by the support structure (and hence a non-negligible temperature gradient is maintained across the thermoelectric elements).

As should be understood, the principles of the present disclosure equivalently apply to any cavity-based thermoelectric generator, irrespective of the structure (e.g., shape) and/or electrical connection and/or material of the thermoelectric elements.

Figure 3A:
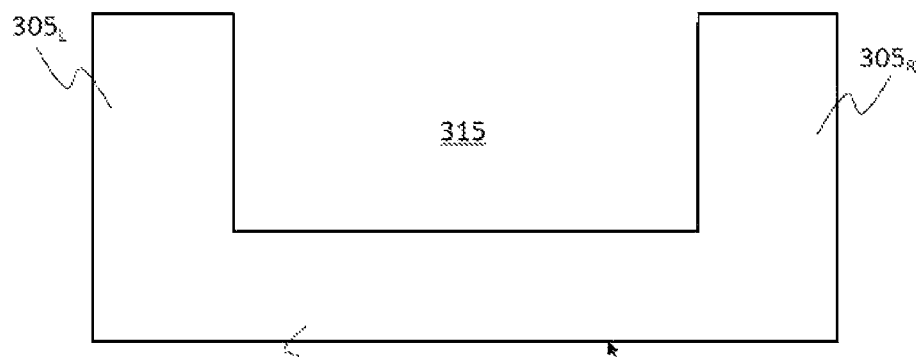
FIGS. 3A-3C show main manufacturing steps of a cavity-based thermoelectric generator according to some embodiments.
Figure 3B:
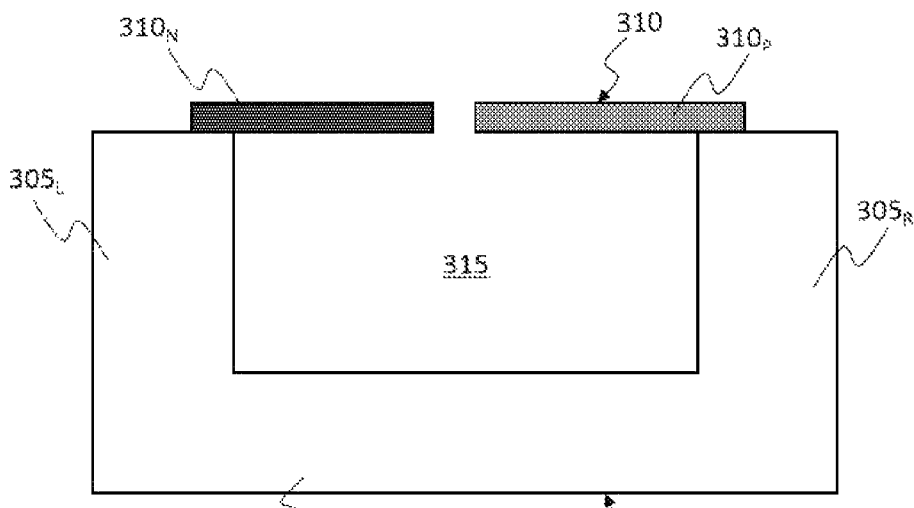
Figure 3C:
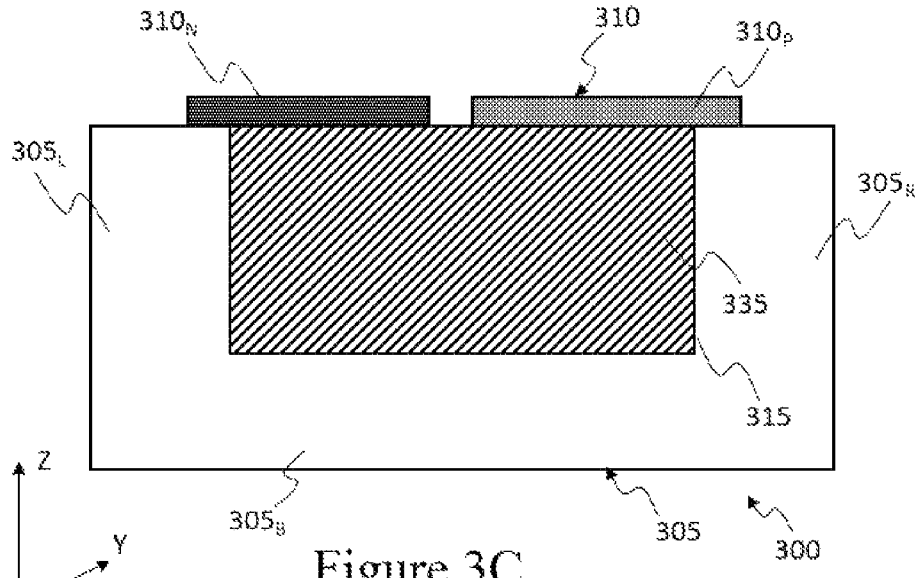

With reference now to FIGS. 3A-3C, they show main manufacturing steps of a (generic) cavity-based thermoelectric generator 300 according to an embodiment of the present disclosure.

A substrate 305 is first provided (FIG. 3A). In the exemplary considered embodiment, the substrate 305 has an internally hollow structure, i.e., it includes (similarly to the previous embodiments) a cavity 315 delimited by a bottom portion 305E of the substrate 305 and by left 305L and right 305S side portions of the substrate 305 extending in height beyond the bottom portion 305B. According to an embodiment, the cavity 315 is formed through an etching process performed on a standard, flat solid substrate structure.

However, as discussed above, the cavity 315 may be defined between a standard, flat solid substrate structure and the thermoelectric elements above it by any other structural expedient.

On the substrate 305, one or more thermoelectric elements 310 are provided (FIG. 3B), each one configured to convert a thermal drop across the thermoelectric element into an electric potential by Seebeck effect.

Depending on the structure (e.g., shape) and/or electrical connection and/or material of the thermoelectric elements 310, different manufacturing techniques may be used to form the thermoelectric elements 310, such as advanced lithography, highly anisotropic etching, and/or highly directional vertical etching (as discussed, for example, in G. Pennelli, E. Dimaggio, and M. Macucci, "*Fabrication Techniques for Thermoelectric Devices Based on Nanostructured Silicon*", Journal of Nanoscience, and Nanotechnology, Vol. 17, pages 1627-1633, 2017.

Irrespective of the structure (e.g., shape) and/or electrical connection and/or material of the thermoelectric elements 310, the thermoelectric elements 310 of the (generic) cavity-based thermoelectric generator 300 include a plurality of interconnected thermoelectric nanostructures (such as the nanowires or nanomembranes discussed in the previous embodiments) having a N-type conductivity $310_N$, and thermoelectric nanostructures (such as the nanowires or nanomembranes discussed in the previous embodiments) having a P-type conductivity $310_P$.

The N-type conductivity of the thermoelectric nanostructures $310_N$ and the P-type conductivity of the thermoelectric nanostructures $310_P$ may for example be obtained by manufacturing the nanostructures in an intrinsic semiconductor material (such as silicon or polysilicon) and by doping it through any proper vapor-phase epitaxy technique.

A support structure 335 (having a thermal conductivity lower than the thermal conductivity of the substrate) is provided within the cavity 315 for supporting the thermoelectric elements (FIG. 3C).

According to the exemplary considered embodiment, in order to obtain the support structure 335, the cavity 315 is (completely, or substantially completely) filled with one or more materials among porous silicon, HSQ and HDP. According to an embodiment, deposition techniques such as electrochemical deposition, may be used to fill the cavity 315 with one or more of such materials.

According to an embodiment, the support structure 335 (such as the cavity filling) is performed before forming the thermoelectric elements 310.

Naturally, in order to satisfy local and specific specifications, a person skilled in the art may apply to the disclosure described above many logical and/or physical modifications and alterations. More specifically, although the present disclosure has been described with a certain degree of particularity with reference to preferred embodiments thereof, it should be understood that various omissions, substitutions and changes in the form and details as well as other embodiments are possible. In particular, different embodiments of the disclosure may even be practiced without the specific details set forth in the preceding description for providing a more thorough understanding thereof; on the contrary, well-known features may have been omitted or simplified in order not to encumber the description with unnecessary details. Moreover, it is expressly intended that specific elements and/or method steps described in connection with any disclosed embodiment of the disclosure may be incorporated in any other embodiment.

In particular, similar considerations apply if the thermoelectric generator has a different structure or includes equivalent components. In any case, any component thereof may be separated into several elements, or two or more components may be combined into a single element; furthermore, each component can be replicated to support the execution of the corresponding operations in parallel. It should also be noted that (unless otherwise indicated) any interaction between different components generally does not need to be continuous, and may be either direct or indirect through one or more intermediaries.

Moreover, the present disclosure lends itself to be implemented through an equivalent method (by using similar steps, removing some steps being not essential, or adding further optional steps); moreover, the steps may be performed in different order, concurrently or in an interleaved way (at least partly).

In addition, although in the foregoing explicit reference to a thermoelectric generator has been made, it should be easily understood that the principles of the present disclosure may also be applied, possibly with proper structural modifications that will be within the reach of the skilled person, to a thermoelectric cooler (also called Peltier cooler), i.e., a device that, by Peltier effect, is capable of creating a heat flux at the junction of two different types of materials.

Furthermore, same considerations apply to a device conceived to operate both as thermoelectric generator and as a thermoelectric cooler: when operated as a thermoelectric cooler, a voltage is applied across the device, and as a result, a difference in temperature will build up between the two sides (Peltier effect); when operated as a thermoelectric generator, one side of the device is heated to a temperature greater than the other side, and as a result, a difference in voltage will build up between the two sides (Seebeck effect).

The various embodiments described above can be combined to provide further embodiments. All of the U.S. patents, U.S. patent application publications, U.S. patent applications, foreign patents, foreign patent applications and non-patent publications referred to in this specification and/ or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A thermoelectric generator, comprising:
a substrate having a first side that is opposite to a second side and a third side that is opposite to a fourth side;
a plurality of first thermoelectric elements of a first conductivity type on the substrate;
a plurality of second thermoelectric elements of a second conductivity type on the substrate;
a cavity between the substrate and the first and second thermoelectric elements;
a support structure within the cavity and supporting the first and second thermoelectric elements;
a first electrical connector directly in contact with the first side of the substrate and extending from the third side to the fourth side, the first electrical connector coupled to the plurality of first thermoelectric elements;
a second electrical connector directly in contact with the second side of the substrate and extending from the third side to the fourth side, the second electrical connector coupled to the plurality of second thermoelectric elements; and
a third electrical connector directly in contact with the support structure between the first electrical connector and the second electrical connector and extending from the third side to the fourth side, the third electrical connector coupled to the plurality of first thermoelectric elements and the plurality of second thermoelectric elements.

2. The thermoelectric generator according to claim 1, wherein a ratio between a thermal conductivity of the support structure and a thermal conductivity of the substrate is lower than 0.02.

3. The thermoelectric generator according to claim 1, wherein the support structure includes at least one material having a thermal conductivity below 2 W/mK.

4. The thermoelectric generator according to claim 3, wherein the at least one material including at least one among porous silicon, hydrogen silsesquioxane and high density plasma oxide.

5. The thermoelectric generator according to claim 3, wherein the cavity is filled with the at least one material.

6. The thermoelectric generator according to claim 1, wherein the first thermoelectric elements are first thermoelectric nanostructures, wherein the second thermoelectric elements are second thermoelectric nanostructures.

7. The thermoelectric generator according to claim 6, wherein the first and second thermoelectric nanostructures are made of silicon.

8. The thermoelectric generator according to claim 6, wherein the first and second thermoelectric nanostructures are made of polysilicon.

9. A method for manufacturing a thermoelectric generator, comprising:
forming a plurality of first thermoelectric elements having a first conductivity type on a first side of a substrate;
forming a plurality of second thermoelectric elements having a second conductivity type on a second side of the substrate, the second side of the substrate being opposite the first side of the substrate;
forming a cavity between the substrate and the first and second thermoelectric elements;
forming, within the cavity, a support structure for supporting the first and second thermoelectric elements;
forming, between the cavity and the plurality of first thermoelectric elements and the plurality of second thermoelectric elements, an electrically insulating layer in contact with the support structure;
forming, directly in contact with the first side of the substrate, a first connector coupled to the plurality of first thermoelectric elements;
forming, directly in contact with the second side of the substrate, a second connector coupled to the plurality of second thermoelectric elements; and
forming, directly in contact with the support structure between the first connector and the second connector, a third connector coupled to the plurality of first thermoelectric elements and the plurality of second thermoelectric elements.

10. The method of claim 9, further comprising forming the cavity after providing the first and second thermoelectric elements.

11. The method of claim 9, further comprising forming the cavity before providing the first and second thermoelectric elements.

12. The method of claim 9, wherein the first thermoelectric elements are first thermoelectric nanostructures, wherein the second thermoelectric elements are second thermoelectric nanostructures.

13. The method of claim 12, further comprising:
doping the first thermoelectric nanostructures with N-type dopants; and
doping the second thermoelectric nanostructures with P-type dopants.

14. A thermoelectric generator, comprising:
a substrate having a first side that is opposite to a second side and a third side that is opposite to a fourth side;
a cavity in the substrate;
a support structure in the cavity;
a first electrical connector directly in contact with the first side of the substrate and extending from the third side to the fourth side;
a second electrical connector directly in contact with the second side of the substrate and extending from the third side to the fourth side;
a third electrical connector between the first electrical connector and the second electrical connector, the third electrical connector being centrally located above the cavity and the support structure and extending from the third side to the fourth side; and
a thermoelectric element including:
a plurality of first thermoelectric nanostructures coupled between the first electrical connector and the third electrical connector and supported above the substrate by the support structure and doped with N-type dopants; and a plurality of second thermoelectric nanostructures coupled between the second electrical connector and the third electrical connector and supported above the substrate by the support structure and doped with P-type dopants.

15. The thermoelectric generator of claim 14, wherein the substrate having a thermal conductivity at least 50 times greater than a thermal conductivity of the support structure.

16. The thermoelectric generator of claim 14, wherein the support structure entirely fills the cavity.

17. The thermoelectric generator of claim 14, further comprising an electrically insulating layer between the support structure and the first and second thermoelectric nano structures.

* * * * *